United States Patent
Kusunoki

(10) Patent No.: US 7,928,799 B2
(45) Date of Patent: Apr. 19, 2011

(54) POWER AMPLIFYING APPARATUS AND MOBILE COMMUNICATION TERMINAL

(75) Inventor: Shigeo Kusunoki, Kanagawa (JP)

(73) Assignee: Sony Ericsson Mobile Communications Japan, Inc., Tokyo (JP)

(*) Notice: Subject to any disclaimer, the term of this patent is extended or adjusted under 35 U.S.C. 154(b) by 71 days.

(21) Appl. No.: 12/423,344

(22) Filed: Apr. 14, 2009

(65) Prior Publication Data

US 2009/0201085 A1 Aug. 13, 2009

Related U.S. Application Data

(63) Continuation of application No. 11/840,691, filed on Aug. 17, 2007, now Pat. No. 7,589,589.

(30) Foreign Application Priority Data

Sep. 1, 2006 (JP) ................................. 2006-238118

(51) Int. Cl.
*H03F 1/14* (2006.01)
*H03F 3/68* (2006.01)

(52) U.S. Cl. ........................................ 330/51; 330/124 R

(58) Field of Classification Search .................... 330/51, 330/124 R
See application file for complete search history.

(56) References Cited

U.S. PATENT DOCUMENTS

| 5,438,684 A | 8/1995 | Schwent et al. |
| 6,700,444 B2 | 3/2004 | Pengelly |
| 7,224,221 B2 | 5/2007 | Kobayashi et al. |
| 7,498,878 B2 * | 3/2009 | Lim .......................... 330/124 R |

FOREIGN PATENT DOCUMENTS

| EP | 1 492 228 A1 | 12/2004 |
| EP | 1 583 228 A2 | 10/2005 |
| JP | 7-22852 | 1/1995 |
| JP | 2005-102146 | 4/2005 |
| JP | 2005-117599 | 4/2005 |
| JP | 2005-525727 | 8/2005 |
| JP | 2006-148523 | 6/2006 |
| WO | WO 93/18590 | 9/1993 |

OTHER PUBLICATIONS

Japanese Office Action issued Nov. 19, 2010, in Japanese Patent Application No. 2006-238118, Sep. 7, 2006.

* cited by examiner

*Primary Examiner* — Steven J Mottola
(74) *Attorney, Agent, or Firm* — Oblon, Spivak, McClelland, Maier & Neustadt, L.L.P.

(57) ABSTRACT

A power amplifying apparatus includes an input terminal configured to receive an input signal, a first power amplifier biased for class A or class AB operation which is configured to amplify the input signal, an output terminal connected to an output of the first power amplifier, a second power amplifier biased for class C operation which is configured to receive and amplify a part of the input signal, and a switch connected between an output of the second power amplifier and the output terminal.

2 Claims, 6 Drawing Sheets

POWER AMPLIFYING APPARATUS AND MOBILE COMMUNICATION TERMINAL

CROSS REFERENCES TO RELATED APPLICATIONS

This application is a continuation of application Ser. No. 11/840,691, filed Aug. 17, 2007, which is based upon and claims the benefit of priority from prior Japanese Patent Application JP 2006-238118 filed in the Japanese Patent Office on Sep. 1, 2006, the entire contents of both of which are incorporated herein by reference.

BACKGROUND OF THE INVENTION

1. Field of the Invention

The present invention relates to power amplifying apparatuses. In particular, the present invention relates to a power amplifying apparatus suitable for power amplification of OFDM (orthogonal frequency division multiplexing) modulated signals for a mobile communication device and a mobile communication terminal which uses the power amplifying apparatus.

2. Description of the Related Art

OFDM (orthogonal frequency division multiplexing) techniques have been developed for increasing transmission rates of communication signals used for mobile communication devices and improving frequency utilization efficiency. OFDM realizes a very high transmission rate with a very narrow frequency bandwidth, making this technique attractive especially in an environment with limited frequency resources. However, a peak factor (a ratio of a peak power to an average power) in OFDM is very large, such as 10 dB or larger, compared with that in other techniques such as CDMA (code division multiple access) in which the peak factor is approximately 3 dB. This large peak factor increases the amount of load imposed on power amplifiers for mobile communication devices or the like.

Power amplifiers for use in OFDM systems which are composed of single transistors are known. Such power amplifiers can increase the output level by no more than several dB even when distortion compensation is performed, and thus may not be effective for a signal having a peak factor as high as 10 dB. To address this shortcoming, a power amplifier in which separate amplifying elements each operating on the basis of an output power level and outputs of the amplifying elements are combined has been proposed. Examples of such a composite power amplifier include LINC (linear amplification with nonlinear component) amplifiers and Doherty amplifiers. An amplifier configuration based on Doherty amplifiers may be suitable to deal with the above shortcoming, taking into account the characteristics of OFDM systems described above (see Japanese Unexamined Patent Application Publication No. H7-022852).

SUMMARY OF THE INVENTION

In implementation of a Doherty amplifier, the performance is affected by impedance variation at an output combining part that combines the outputs of a so-called carrier amplifier and peak amplifier. A peak amplifier is configured to amplify a signal having a signal level exceeding a predetermined threshold. When the peak amplifier is not operating, the output impedance at the output combining part of the Doherty amplifier has to be open-circuited at high frequencies.

However, such an ideal state is difficult to achieve for the following reasons. For example, when a field-effect transistor (FET) is used as a peak amplifier, its drain conductance is obtained from a carrier amplifier as a finite value. In general, this value exhibits large non-linearity with respect to a drain voltage variation. Thus, radiation and distortion may occur in the peak amplifier when only the carrier amplifier is operating. In addition, the drain conductance is generally not constant since it depends on the channel impedance of a device, which consequently causes design variation. When a heterojunction bipolar transistor (HBT) is used as a peak amplifier, the variation in collector conductance can be low compared with a FET. However, the non-linearity of the collector conductance is large, and thus problems associated with distortion or the like still exist.

There has been no device that can realize the ideal state described above. Thus a technique which realizes an open-circuit-like state by circuit arrangement has been developed. Such a technique is disclosed in, for example, Japanese Unexamined Patent Application Publication No. 2005-117599. This technique is intended to reduce a loss of composite output power which occurs when a back-off with which a power amplifier operates is changed in accordance with the level of an input signal. However, this technique has a serious disadvantage in that the efficiency of an entire power amplifying apparatus is lowered when changing the back-off value.

Japanese Unexamined Patent Application Publication No. 2005-525727 discloses another technique. In this technique, a plurality of auxiliary power amplifiers are sequentially turned on in accordance with power levels so that the range of impedance change in power combining is increased. This technique is intended to stabilize the performance of a power amplifying apparatus. However, with this technique, the number of auxiliary amplifiers significantly increases, resulting in an increase in the size of the entire power amplifying apparatus and a decrease in efficiency.

The present invention has been made in view of the above circumstances. Accordingly, there is a need for a power amplifying apparatus that has a simple configuration and overcomes the problems of distortion and efficiency for a signal having a relatively large peak factor.

A power amplifying apparatus according to an embodiment of the present invention includes an input terminal configured to receive an input signal, a first power amplifier biased for class A or class AB operation which is configured to amplify the input signal, an output terminal connected to an output of the first power amplifier, a second power amplifier biased for class C operation which is configured to receive and amplify a part of the input signal, and a switch connected between an output of the second power amplifier and the output terminal.

In this power amplifying apparatus, when the input signal has a low power level, only the first power amplifier operates and the second power amplifier is in a non-operating state. At this time, the switch is in an OFF state. Thus, even when radiation or distortion is generated from the second power amplifier, the radiation or distortion is not transmitted to the output terminal. When the power level of the input signal increases and exceeds a predetermined level, the second power amplifier enters an operating state and the switch is turned on. Thus, the outputs of both the power amplifiers are combined.

This power amplifying apparatus is preferred for amplifying a signal having a relatively large peak factor such as an OFDM modulated signal used in a mobile communication terminal or the like.

In a power amplifying apparatus according to an embodiment of the present invention, even when radiation or distortion is generated from a second power amplifier in class C operation during its OFF state, a high-efficient power amplifying operation can be performed on an OFDM modulated signal without increasing distortion in a class A or class AB power amplifier, by cutting off the second power amplifier from the power combining point using a switch.

DESCRIPTION OF THE PREFERRED EMBODIMENTS

In the following, the preferred embodiments of the present invention will be described with reference to the accompanying drawings.

Figure 3:
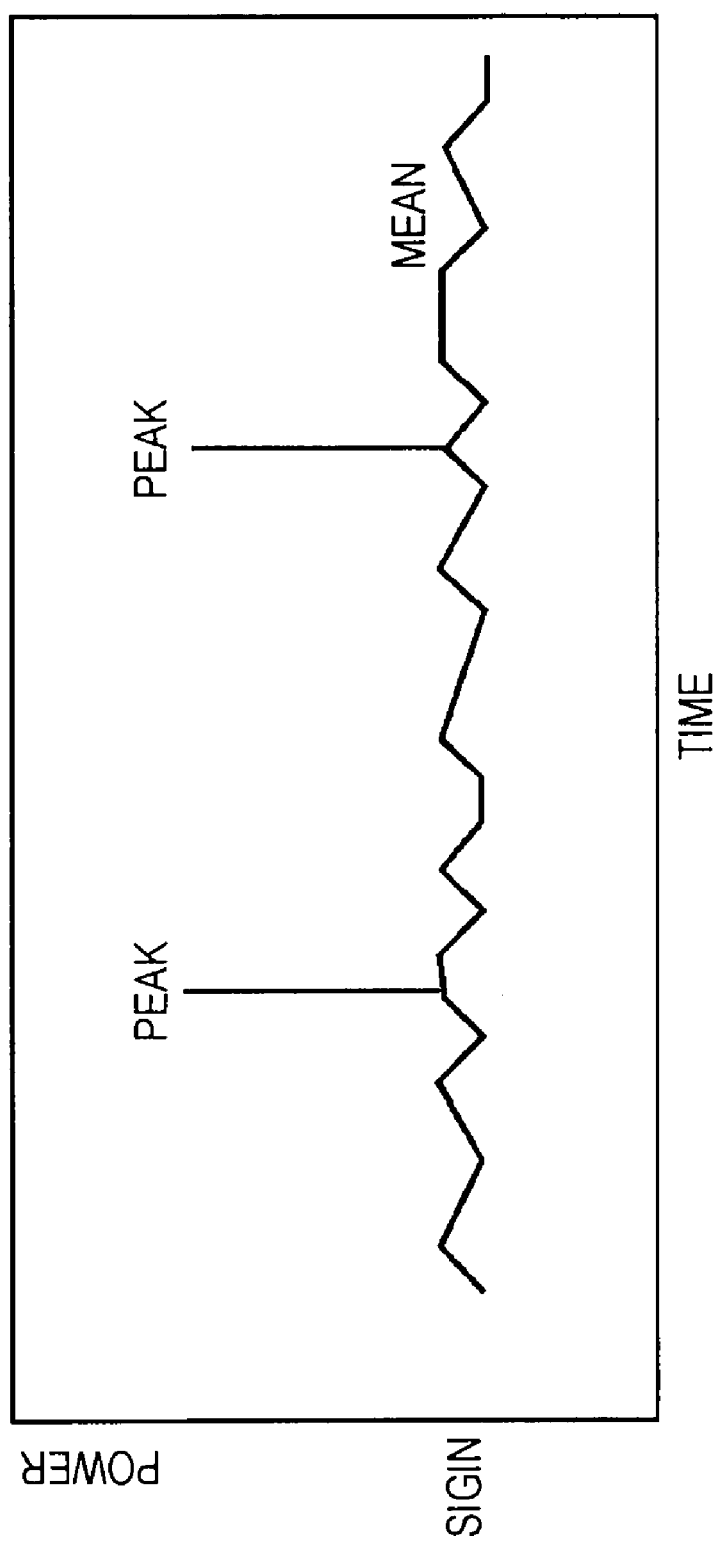
FIG. 3 illustrates an example of power variation of an OFDM signal with time.

Prior to the description of the preferred embodiments, a problem associated with amplification of OFDM signals using a power amplifier will be described. FIG. 3 illustrates an example of power variation of an OFDM signal with time. One characteristic of an OFDM signal is a very large difference between the average power indicated as "mean" and peak power indicated as "peak" as shown in FIG. 3. This difference may be 10 dB or greater. The ratio of peak power to average power is called a peak factor. In order to amplify a signal having a large peak factor using a power amplifier without producing distortion, a power amplifier having a saturation output power of 38 dBm or larger may be necessary where, for example, an average output power of 28 dBm is desired. However, a power amplifier in a mobile terminal generally operates at approximately 28 dBm during a large part of transmission time, indicating a back-off of 10 dB. In general, the efficiency of a power amplifier decreases with decreasing output power. For example, in the case of a power amplifier having a saturation output power of 38 dBm, the efficiency at 28 dBm output power is as low as approximately 5 percent whereas the efficiency at 38 dBm output power is 40 percent. This power loss may cause a mobile communication terminal serious problems in terms of continuous operation time and heat output.

Figure 1:
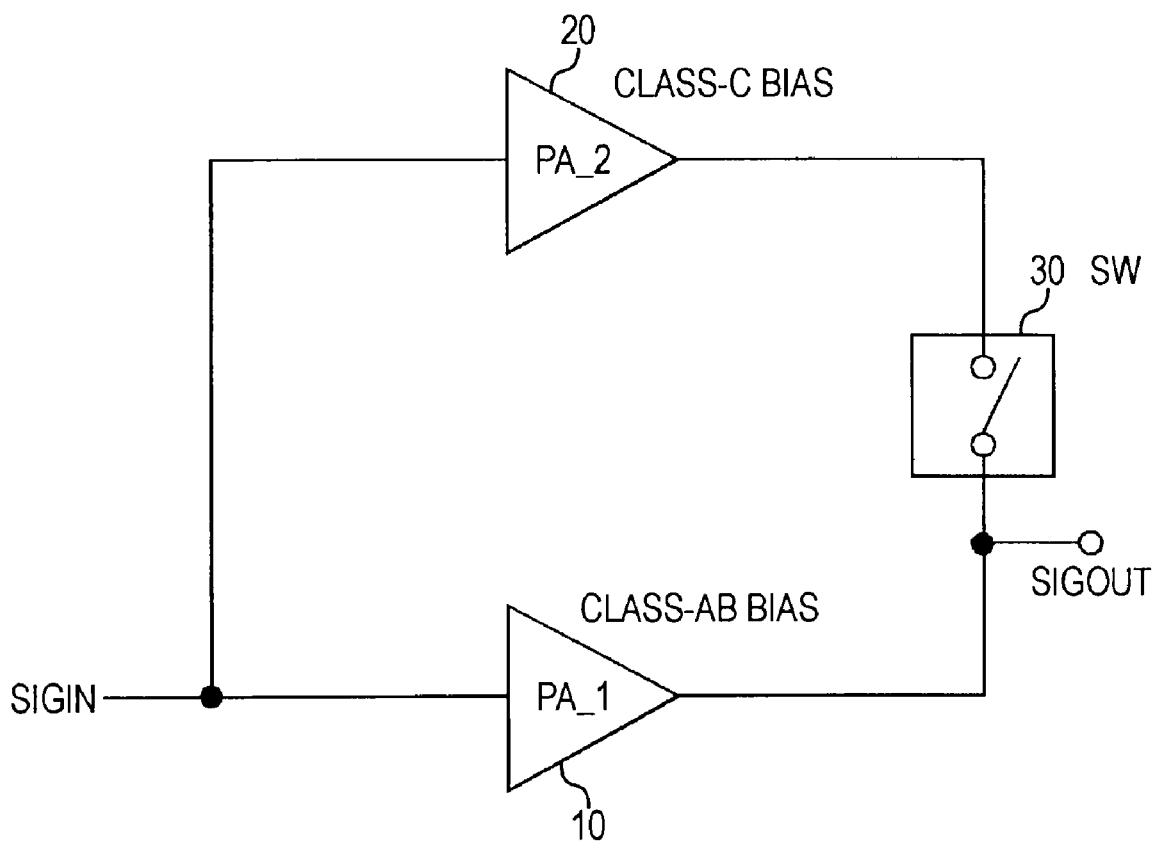
FIG. 1 is a block diagram schematically illustrating a configuration of a power amplifying apparatus according to an embodiment of the present invention.

FIG. 1 is a block diagram schematically illustrating a configuration of a power amplifying apparatus according to an embodiment of the present invention. This power amplifying apparatus is a composite power amplifying apparatus having a first power amplifier 10 (PA_1) and a second power amplifier 20 (PA_2).

The first power amplifier 10 is biased for class AB operation (class A bias may be applied instead of class AB bias). The second power amplifier 20 receives a part of a signal SIGIN as input and is biased for class C operation. The outputs of both the power amplifiers 10 and 20 are coupled via a switch 30 (SW). An output terminal of the power amplifier 10 serves as an output terminal SIGOUT of the power amplifying apparatus. When the input signal SIGIN has a low power level, the power amplifier 10 is in an operating state and the power amplifier 20 is in a non-operating state. At this time the switch 30 is in an OFF state. When the power level of the input signal SIGIN increases and exceeds a predetermined level, the power amplifier 20 enters the operating state and the switch 30 is turned on, and thus the outputs of the power amplifiers 10 and 20 are combined. The signals passing through the power amplifier 10 and the power amplifier 20 are adjusted so as to have the same phase value, so that the outputs of both the power amplifiers 10 and 20 are combined while being in phase.

Figure 4:
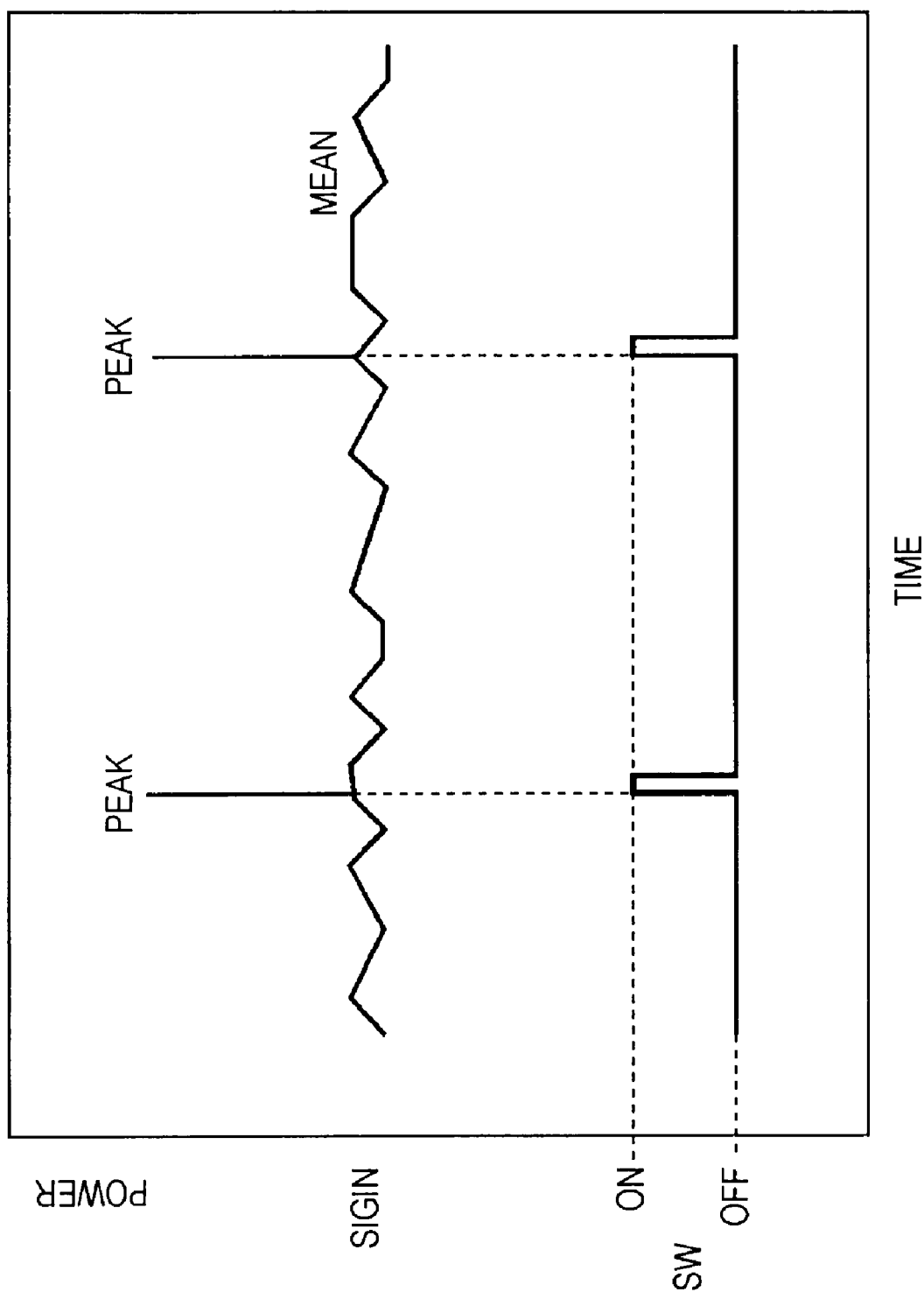
FIG. 4 illustrates a switching operation on an OFDM signal.

An operation of a power amplifying apparatus according to an embodiment of the present invention being applied to OFDM will be described. The input signal SIGIN illustrated in FIG. 3 is assumed to be an OFDM signal. In this case, when the input signal SIGIN has a mean power value (mean state), only the power amplifier 10 operates. At this time, as illustrated in FIG. 4, the switch 30 is in the OFF state. The efficiency of the power amplifying apparatus under this condition can be around 40 percent. When the input signal SIGIN has a peak power value (peak state), the power amplifier 20 operates and the switch 30 enters the ON state. Thus, the outputs of power amplifiers 10 and 20 are combined in phase and the saturation output power increases.

Note that a class C power amplifier is generally capable of high-efficiency operation and theoretically has an efficiency of 100 percent (approximately 65 percent in practice due to signal degradation in a drive stage). Thus, a class C power amplifier can operate with an efficiency of approximately 26 percent while in the peak state. The efficiency of the class C power amplifier in the peak state is lower than that in the mean state. However, influence of such a decrease in the efficiency on a battery life and heating can be ignored since the time period during which the power amplifier operates at the peak state is very short.

Figure 2:
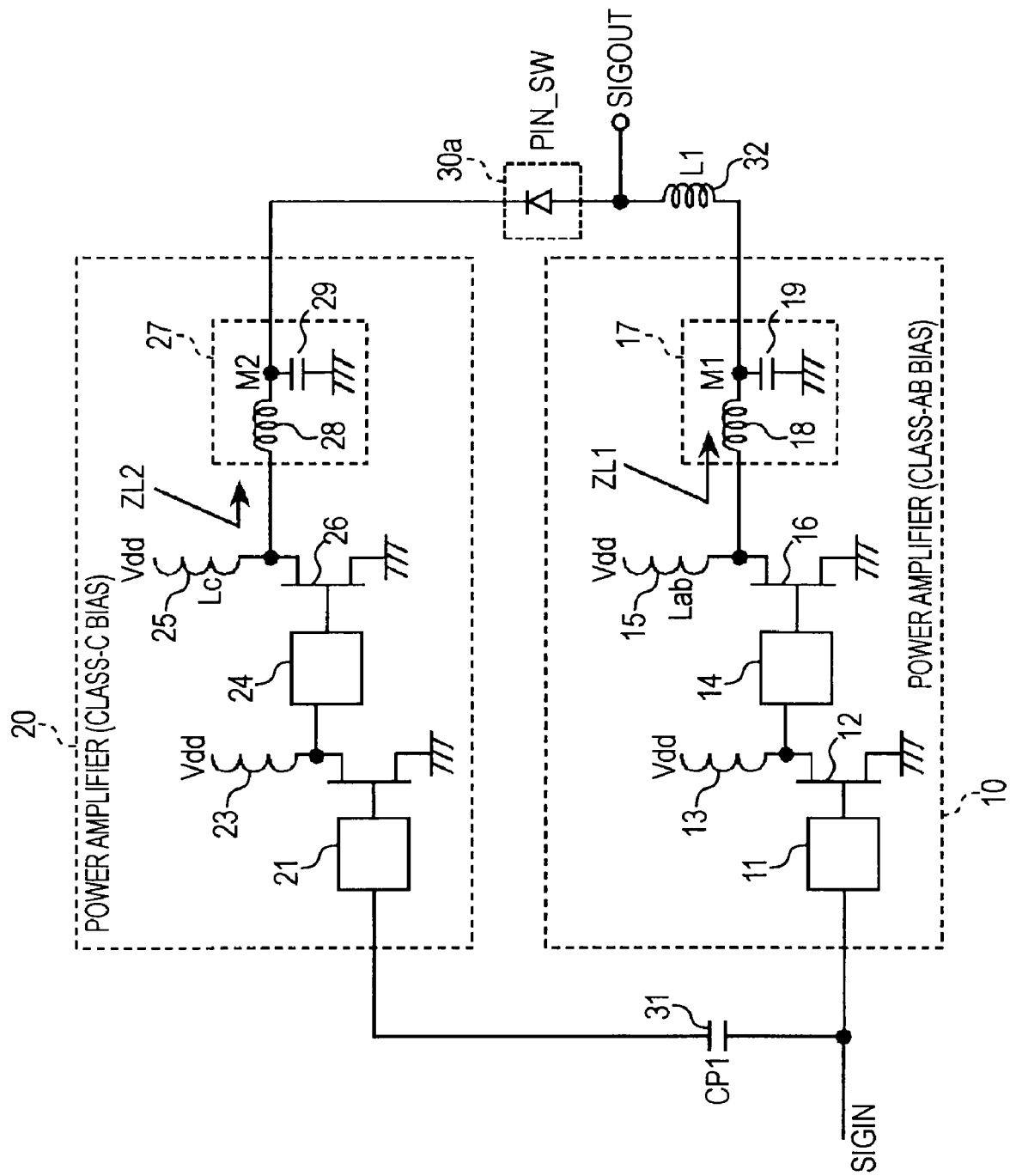
FIG. 2 illustrates a first circuit configuration of a power amplifying apparatus according to an embodiment of the present invention.

FIG. 2 illustrates a first circuit configuration of a power amplifying apparatus according to an embodiment of the present invention. In this power amplifying apparatus, a part of an input signal SIGIN is divided between a capacitor 31 (COP) and divided signals are input to the power amplifier 10 and the power amplifier 20. A PIN diode 30a (PIN_SW) is used as the switch 30 whose cathode terminal is connected to an output terminal of the power amplifier 20 and whose anode terminal is connected to the output terminal SIGOUT. The output terminal of the power amplifier 10 is connected to the output terminal SIGOUT via a coil 32 (L1).

Each of the power amplifier 10 and the power amplifier 20 is a FET amplifier having a two-stage dependent configuration.

The power amplifier 10 has FETs 12 and 16 and is class AB biased. The gate terminal of the first-stage common-source FET 12 receives the input signal SIGIN through a matching circuit 11. The drain terminal receives a drain voltage Vdd through a power supply coil 13. The drain terminal of the FET 12 is connected to the gate terminal of the second-stage common-source FET 16 through a matching circuit 14. The drain terminal of the FET 16 is supplied with a drain voltage Vdd through a power supply coil 15 (Lab). The drain terminal of the FET 16 is connected to the output terminal SIGOUT through a matching circuit 17 (M1) and a coil 32 (L1). The matching circuit 17 has a coil 18 connected to the drain terminal of the FET 16 and a capacitor 19 connected between the coil 18 and the ground. The matching circuit 17 optimizes constants to obtain a matching impedance ZL1 for maximum power output.

The power amplifier 20 has FETs 22 and 26, similarly to the power amplifier 10. However, unlike the power amplifier 10, the power amplifier 20 operates under a class C bias condition. The gate terminal of the first-stage common-source FET 22 receives the input signal SIGIN through the capacitor 31 and a matching circuit 21. The drain terminal is supplied with a drain voltage Vdd through a power supply coil 23. The drain terminal of the FET 22 is connected to the gate terminal of the second-stage common-source FET 26 through a matching circuit 24. The drain terminal of the FET 26 is supplied with a drain voltage Vdd through a power supply coil 25 (Lc). The drain terminal of the FET 26 is connected to the output terminal SIGOUT through a matching circuit 27 (M2) and a switch (PIN_SW) formed of the PIN diode 30a described above. The matching circuit 27 has a coil 28 connected to the drain terminal of the FET 26 and a capacitor 29 connected between the coil 28 and the ground. The matching circuit 27 optimizes constants to obtain a matching impedance ZL2 for maximum power output.

When the input signal SIGIN is an OFDM signal as illustrated in FIG. 3, only the power amplifier 10 operates and the power amplifier 20 is in the non-operating state while the input signal SIGIN is in the mean state. At this time, no current is flowing through the switch of a PIN diode 30a and thus the PIN diode 30a is OFF. When the input signal SIGIN is in the peak state, the power amplifier 20 is in the ON state, and a current flows in the drain terminal of the FET 26 through a coil Lc. At the same time, a current also flows in the PIN diode 30a through a path that includes Vdd, Lab, the coil 18 in M1, the PIN diode 30a, the coil 28 in M2, and the drain of the FET 26 of the power amplifier 20. Thus, the PIN diode 30a is turned on. Operation performed thereafter is as described above.

According to the circuit configuration as illustrated in FIG. 2, switching timing of the switch 30 is autonomously determined. Thus, a specific control circuit for the switch 30 is not necessary.

Figure 5:
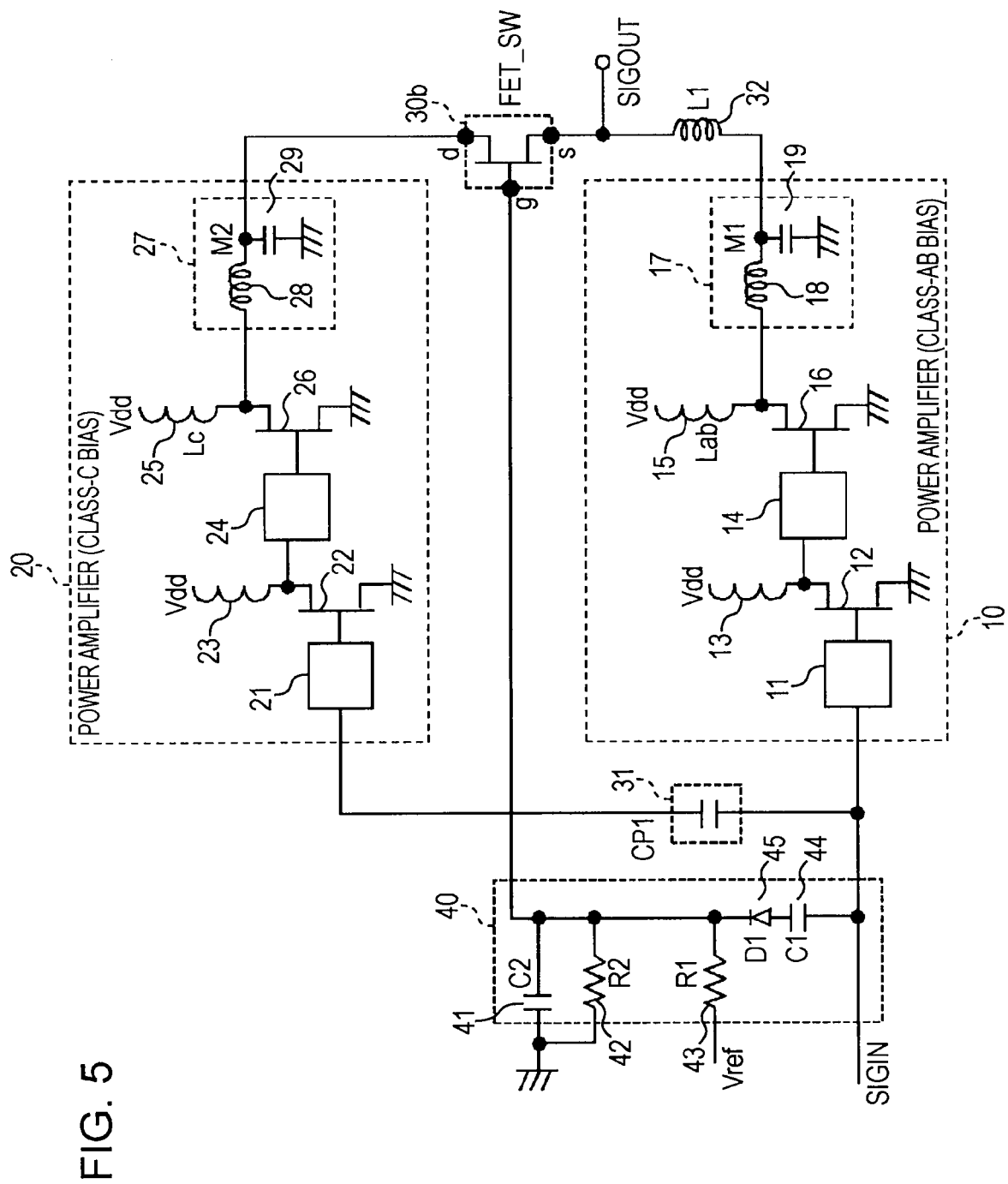
FIG. 5 illustrates a second circuit configuration of a power amplifying apparatus according to an embodiment of the present invention.
Figure 6:
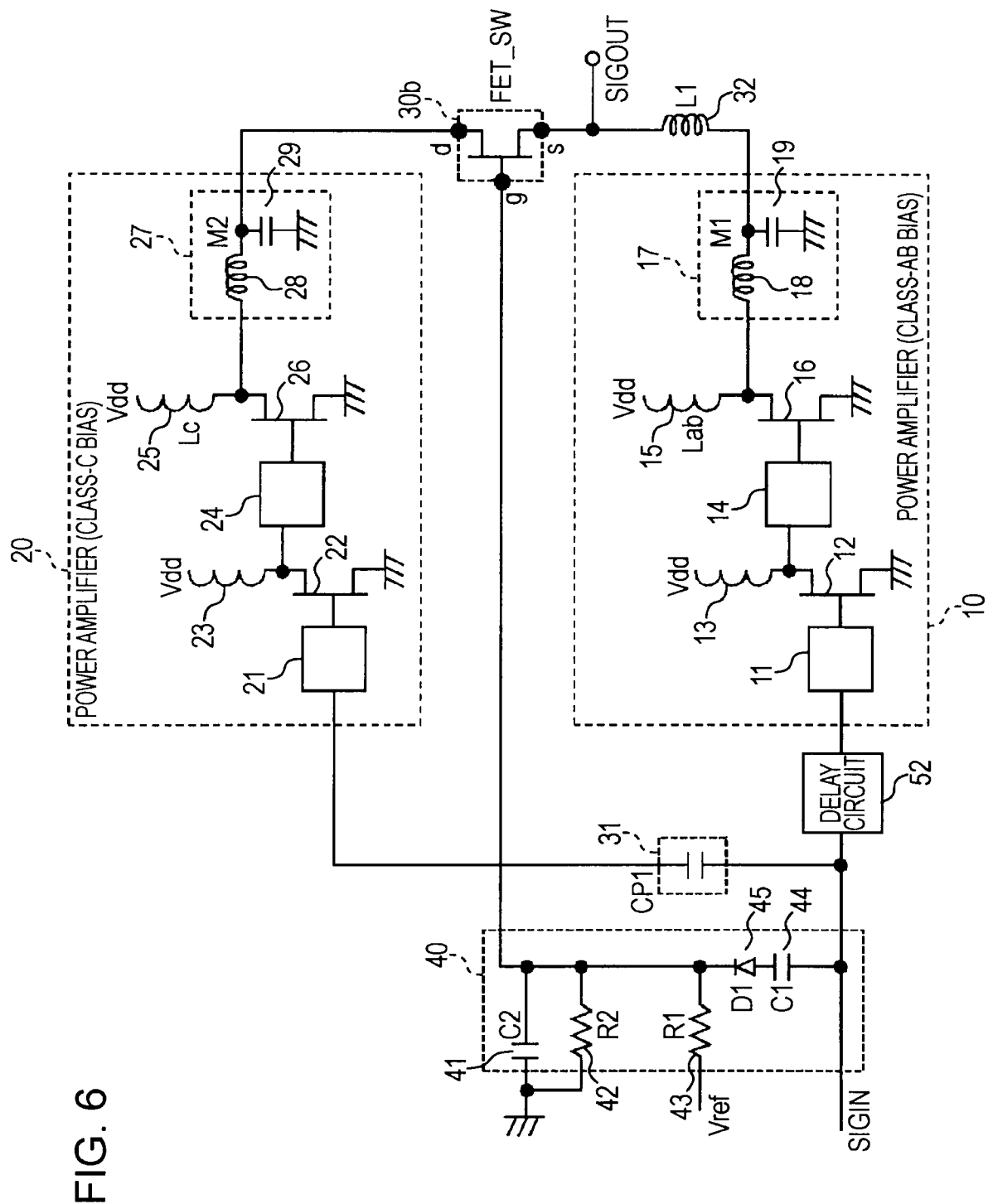
FIG. 6 illustrates an example of a modification of the second circuit configuration.

FIG. 5 illustrates a second circuit configuration of a power amplifying apparatus according to an embodiment of the present invention. Components corresponding to those of the first circuit configuration illustrated in FIG. 2 are denoted by the same reference numerals, and the description thereof will be omitted. In this embodiment, a FET 30b (FET_SW) serves as the switch 30 and its source terminal is connected to the output terminal SIGOUT. The drain terminal of the FET 30b is connected to the output terminal of the power amplifier 20 and the gate terminal of the FET 30b is connected to a detector circuit 40 which serves as a control signal generating circuit for generating a control signal (voltage) at the gate terminal of the FET 30b for switching operation. This detector circuit 40 divides a part of the input signal SIGIN using a capacitor C1 and generates a detector output using a detector diode 45 (D1), a resistor 42 (R2), and a capacitor 41 (C2). This circuit extracts an envelope component and applies the envelope as a gate voltage of the FET 30b. The cathode of the detector diode 45 (D1) receives a reference voltage Vref through a resistor 43 (R1). This allows the setting of a power level (threshold) for ON/OFF operations of the FET 30b.

An operation of a power amplifying apparatus having the above configuration when applied to an OFDM signal illustrated in FIG. 3 will be described. As illustrated in FIG. 4, when the input signal is in the mean state, only the power amplifier 10 operates and the power amplifier 20 is in the non-operating state. At this time, the output level of the detector circuit 40 is low and thus the FET 30b is not turned on. When the input signal SIGIN is in the peak state and the power amplifier 20 is turned on, the output level of the detector circuit 40 is high and thus the FET 30b is turned on.

In the circuit configuration illustrated in FIG. 5, there may be a delay in generation of a control signal by the detector circuit 40. This delay may cause an ON/OFF timing of the FET 30b to be shifted from a peak of the input signal SIGIN. To avoid this fault, a delay circuit 52 which delays the input signal SIGIN by a predetermined time is inserted in the upstream of the power amplifier 10. The delay circuit 52 can be formed of a combination of a resistor and a capacitor, for example, for producing a delay time in accordance with a delay of a control signal in the detector circuit 40.

While the preferred embodiments of the present invention have been described above, various modifications and changes may be made to the embodiments. For example, in the foregoing, the case is described where a FET is used as an amplifying transistor. However, it is also possible to employ a bipolar transistor. When a bipolar transistor is used as the power amplifier 20, the OFF state of the power amplifier 20 can be obtained with increased reliability.

It should be understood by those skilled in the art that various modifications, combinations, sub-combinations and alterations may occur depending on design requirements and other factors insofar as they are within the scope of the appended claims or the equivalents thereof.

What is claimed is:

1. A power amplifying apparatus comprising:
   an input terminal configured to receive an input signal;
   a first power amplifier configured to amplify the input signal, the first power amplifier being biased for class A or class AB operation;
   an output terminal connected to an output of the first power amplifier;
   a second power amplifier configured to receive and amplify a part of the input signal, the second power amplifier being biased for class C operation; and
   a switch connected between an output of the second power amplifier and the output terminal, the switch autonomously controlling the output of the power amplifying apparatus between an output of the first amplifier and a combination of the output of the first amplifier and an output of the second amplifier, wherein
   the switch controls the output of the power amplifying apparatus to be the output of the first amplifier when the input signal is a Orthogonal Frequency Division Multiplexed (OFDM) signal, and
   the switch controls the output of the power amplifying apparatus to be the combination of the output of the first amplifier and the output of the second amplifier when the input signal is in a peak state.

2. A mobile communication terminal provided with a power amplifying apparatus performing power amplification on an OFDM modulated signal, the power amplifying apparatus comprising:
   an input terminal configured to receive an input signal;
   a first power amplifier configured to amplify the input signal, the first power amplifier being biased for class A or class AB operation;
   an output terminal connected to an output of the first power amplifier;
   a second power amplifier configured to receive and amplify a part of the input signal, the second power amplifier being biased for class C operation; and
   a switch connected between an output of the second power amplifier and the output terminal, the switch autonomously controlling the output of the power amplifying apparatus between an output of the first amplifier and a combination of the output of the first amplifier and an output of the second amplifier, wherein the switch controls the output of the power amplifying apparatus to be the output of the first amplifier when the input signal is a Orthogonal Frequency Division Multiplexed (OFDM) signal, and the switch controls the output of the power amplifying apparatus to be the combination of the output of the first amplifier and the output of the second amplifier when the input signal is in a peak state.

* * * * *